United States Patent
Zampardi et al.

(10) Patent No.: US 7,755,107 B2
(45) Date of Patent: Jul. 13, 2010

(54) BIPOLAR/DUAL FET STRUCTURE INCLUDING ENHANCEMENT AND DEPLETION MODE FETS WITH ISOLATED CHANNELS

(75) Inventors: Peter J. Zampardi, Newbury Park, CA (US); Mike Sun, Thousand Oaks, CA (US)

(73) Assignee: Skyworks Solutions, Inc., Woburn, MA (US)

( * ) Notice: Subject to any disclaimer, the term of this patent is extended or adjusted under 35 U.S.C. 154(b) by 20 days.

(21) Appl. No.: 12/284,804

(22) Filed: Sep. 24, 2008

(65) Prior Publication Data

US 2010/0072517 A1    Mar. 25, 2010

(51) Int. Cl.
*H01L 31/0328* (2006.01)
(52) U.S. Cl. .......... 257/197; 257/20; 257/192; 257/272; 257/E27.012
(58) Field of Classification Search ............ 257/12, 257/20, 24, 192, 197, 213, 272, 273, 274, 257/526, 517, 557, E27.012, E27.014, E29.091, 257/E29.19, E31.022, E31.033, E31.067, 257/E21.387, E21.407, E29.078, E29.189, 257/E29.315, E29.25, E29.052, E29.062, 257/E29.064
See application file for complete search history.

(56) References Cited

U.S. PATENT DOCUMENTS 6,906,359 B2    6/2005    Zampardi et al.

OTHER PUBLICATIONS

Otoki, et al., *Mass Production Technology of Large Size III-V Compound Semiconductor Epitaxial Wafers for Microwave Devices by MOVPE*, Hitachi Cable Review, No. 20, 45-50 (2001).
Cheskis, et al., *Co-Integration of GaAlAs/GaAs HBTs and GaAs FETs with a Simple, Manufacturable Process*, IEDM, 4.6.1-4.6.4 (1992).
Chen, et al., *Integrated AlInAs/InGaAs HEMT/HBT Heterostructure Grown by MBE*, IPRM, 656-659 (1995).

*Primary Examiner*—Victor A Mandala
*Assistant Examiner*—Whitney Moore

(57) ABSTRACT

According to an exemplary embodiment, a bipolar/dual FET structure includes a bipolar transistor situated over a substrate. The bipolar/dual FET structure further includes an enhancement-mode FET and a depletion-mode FET situated over the substrate. In the bipolar/dual FET structure, the channel of the enhancement-mode FET is situated above the base of the bipolar transistor and the channel of the depletion-mode FET is situated below the base of the bipolar transistor. The channel of the enhancement-mode FET is isolated from the channel of the depletion-mode FET so as to decouple the enhancement-mode FET from the depletion mode FET.

20 Claims, 3 Drawing Sheets

BIPOLAR/DUAL FET STRUCTURE INCLUDING ENHANCEMENT AND DEPLETION MODE FETS WITH ISOLATED CHANNELS

BACKGROUND OF THE INVENTION

1. Field of the Invention

The present invention generally relates to the field of semiconductor structures. More particularly, the invention relates to transistor semiconductor structures.

2. Background Art

By utilizing BiFET technology, bipolar transistors, such as heterojunction bipolar transistors (HBTs), and field effect transistors (FETs), such as enhancement-mode (E-mode) and depletion-mode (D-mode) FETs, can be integrated on the same semiconductor die to provide increased circuit design flexibility. In an integrated structure, a bipolar transistor, such as an HBT, an E-mode FET, and a D-mode FET can each be advantageously tailored for specific applications. For example, an HBT, a D-mode FET, and an E-mode FET can be integrated on a substrate, such as a semi-insulating gallium arsenide (GaAs) substrate, to form a power amplifier, a bias circuit, and a radio frequency (RF) switch, respectively, for a communications device, such as a cell phone. However, previous attempts at integrating a bipolar transistor with E-mode and D-mode FETs on a substrate have undesirably affected the respective performances of the E-mode and D-mode FETs.

In one conventional approach, for example, an HBT can be formed over a substrate, such as a semi-insulating GaAs substrate, and E-mode and D-mode FETs can be integrated under the sub-collector of the HBT. However, in this conventional approach, the E-mode and D-mode FETs typically have shared epitaxial layers, which can undesirably affect the analog properties of the E-mode FET. Also, as a result of the shared epitaxial layers, coupling can occur between the E-mode and D-mode FETs, which can undesirably affect the RF switching performance of the D-mode FET. Thus, in the aforementioned conventional approach, the performance of the E-mode FET cannot be optimized without affecting the performance of the D-mode FET, and vice versa.

SUMMARY OF THE INVENTION

A bipolar/dual FET structure including enhancement and depletion mode FETs with isolated channels, substantially as shown in and/or described in connection with at least one of the figures, as set forth more completely in the claims.

DETAILED DESCRIPTION OF THE INVENTION

The present invention is directed to bipolar/dual FET structures including enhancement and depletion mode FETs with isolated channels. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention and are not drawn to scale. To maintain brevity, other embodiments of the invention which use the principles of the present invention are not specifically described in the present application and are not specifically illustrated by the present drawings.

As will be discussed in detail below, the present invention provides an innovative bipolar/dual FET structure including a bipolar transistor, such as a heterojunction bipolar transistor (HBT), and E-mode and D-mode FETs, wherein the E-mode FET is isolated from the D-mode FET. Although an exemplary bipolar/dual FET structure comprising an exemplary NPN bipolar transistor, an exemplary E-mode NFET, and an exemplary D-mode NFET are used to illustrate the present invention, the present invention may also apply to bipolar/dual FET structure comprising a PNP bipolar transistor, an E-mode PFET, and a D-mode PFET. Also, although GaAs (gallium arsenide) is a semiconductor material that is utilized to illustrate the present invention, the present invention may also apply to other types of semiconductor material, such as indium phosphide (InP) or gallium nitride (GaN).

Figure 1:
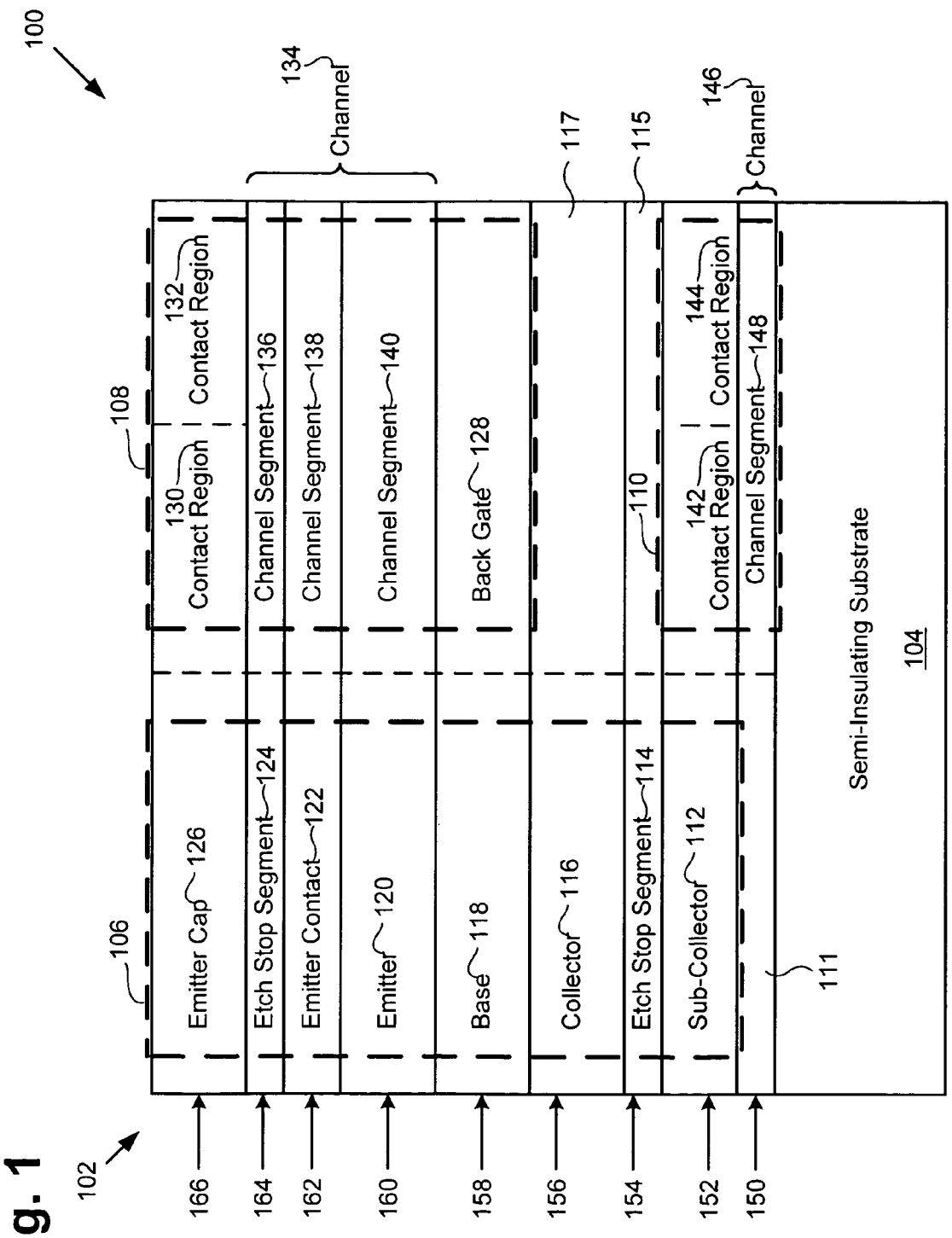
FIG. 1 illustrates a cross-sectional view of an exemplary bipolar/dual FET structure in accordance with one embodiment of the present invention.

FIG. 1 shows a cross-sectional view of a semiconductor die including an exemplary bipolar/dual FET structure in accordance with one embodiment of the present invention. Certain details and features have been left out of FIG. 1, which are apparent to a person of ordinary skill in the art. In FIG. 1, structure 100 includes bipolar/dual FET structure 102 on substrate 104, which can be a semi-insulating GaAs substrate in one embodiment of the present invention. In other embodiments, substrate 104 can comprise indium phosphide, gallium nitride, or other type of semiconductor material. Bipolar/dual FET structure 102 includes bipolar transistor 106, E-mode (enhancement-mode) FET 108, and D-mode (depletion-mode) FET 110. Bipolar transistor 106 includes sub-collector 112, etch stop segment 114, collector 116, base 118, emitter 120, emitter contact 122, etch stop segment 124, and emitter cap 126. Bipolar transistor 106 can comprise, for example, an NPN HBT. In one embodiment, bipolar transistor 106 may comprise a PNP HBT.

E-mode FET 108 includes back gate 128, contact regions 130 and 132, and channel 134, which is a conductive channel and includes channel segments 136, 138, and 140. E-mode FET 108 can be, for example, an NFET. In one embodiment, E-mode FET 108 can be a PFET. E-mode FET 108 can comprise, for example, a heterostructure FET (HFET), such as a High Electron Mobility Transistor (HEMT) or a Pseudomorphic HEMT (PHEMT). In one embodiment, E-mode FET 108 can comprise a Metal-Semiconductor FET (MESFET). D-mode FET 110 includes contact regions 142 and 144 and channel 146, which is a conductive channel and includes channel segment 148. In one embodiment, channel 146 of D-mode FET 110 can comprise multiple channel segments. D-mode FET 110 can be, for example, an NFET. In one embodiment, D-mode FET 110 can be a PFET. D-mode FET 110 can comprise, for example, an HFET, such as a HEMT or PHEMT. In one embodiment, D-mode FET 110 can comprise a MESFET. Bipolar/Dual FET structure 102 also includes isolation regions and base, emitter, collector, source, drain, gate, and back gate contacts, which are not shown in FIG. 1.

Bipolar/Dual FET structure 102 can be utilized in a wireless communication device, such as a cell phone, or other type of electronic device. Bipolar transistor 106 can be utilized, for example, as a power amplifier in a cell phone or other electronic device. E-mode FET 108 can be utilized, for example, in analog applications, such as bias and control applications, and can also be utilized in digital logic circuits. Although well suited for utilization in RF switching applications, D-mode FET 110 can also be utilized in digital logic circuits, for example.

As shown in FIG. 1, epitaxial segment 111 and channel segment 148 are situated over substrate 104. Epitaxial segment 111 and channel segment 148 each comprise a portion of epitaxial layer 150, which can comprise, for example, GaAs in one embodiment. Channel segment 148 can be, for example, a conductive channel segment. In one embodiment, one or more buffer layers can be situated between channel segment 148 and substrate 104. In one embodiment, channel segment 148 can comprise lightly doped N type GaAs. Epitaxial segment 111 and channel segment 148 can be formed, for example, by depositing epitaxial layer 150 over substrate 104 by using a metal organic chemical vapor deposition (MOCVD) process, a molecular beam epitaxy (MBE) process or other deposition process and appropriately patterning epitaxial layer 150. Also shown in FIG. 1, sub-collector 112 is situated over a epitaxial segment 111 and contact regions 142 and 144 are situated over channel segment 148. Sub-collector 112 and contact regions 142 and 144 each comprise a portion of epitaxial layer 152, which can comprise, for example, heavily doped N type GaAs in one embodiment. Sub-collector 112 and contact regions 142 and 144 can be formed, for example, by depositing epitaxial layer 152 over epitaxial layer 150 by using a MOCVD process, an MBE process, or other deposition process and appropriately patterning epitaxial layer 152.

Further shown in FIG. 1, etch stop segment 114 is situated over sub-collector 112 and epitaxial segment 115 is situated over contact regions 142 and 144. Etch stop segment 114 and epitaxial segment 115 each comprise a portion of epitaxial layer 154, which can comprise, for example, indium gallium phosphide (InGaP) in one embodiment. Etch stop segment 114 and epitaxial segment 115 can be formed, for example, by depositing epitaxial layer 154 over epitaxial layer 152 by using a MOCVD process, an MBE process, or other deposition process and appropriately patterning epitaxial layer 154. Also shown in FIG. 1, collector 116 is situated over etch stop segment 114 and epitaxial segment 117 is situated over epitaxial segment 115. Collector 116 and epitaxial segment 117 each comprise a portion of epitaxial layer 156, which can comprise, for example, lightly doped N type GaAs in one embodiment. Collector 116 and epitaxial segment 117 can be formed, for example, by depositing epitaxial layer 156 over epitaxial layer 154 by using a MOCVD process, an MBE process, or other deposition process and appropriately patterning epitaxial layer 156.

Also shown in FIG. 1, base 118 is situated over collector 116 and back gate 128 is situated over epitaxial portion 117 of epitaxial layer 156. Base 118 and back gate 128 each comprise a portion of epitaxial layer 158, which can comprise, for example, heavily doped P type GaAs in one embodiment. Base 118 and back gate 128 can be formed, for example, by depositing epitaxial layer 158 over epitaxial layer 156 by using a MOCVD process, an MBE process, or other deposition process and appropriately patterning epitaxial layer 158. Further shown in FIG. 1, emitter 120 is situated over base 118 and channel segment 140 is situated over back gate 128. Emitter 120 and channel segment 140 each comprise a portion of epitaxial layer 160, which can comprise lightly doped N type InGaP in one embodiment. Emitter 120 and channel segment 140 can be formed, for example, by depositing epitaxial layer 160 over epitaxial layer 158 and appropriately patterning epitaxial layer 160. Channel segment 140 can be, for example, a conductive channel segment.

Also shown in FIG. 1, emitter contact 122 is situated over emitter 120 and channel segment 138 is situated over channel segment 140. Emitter contact 122 and channel segment 138 each comprise a portion of epitaxial layer 162, which can comprise, for example, lightly doped N type GaAs in one embodiment. Emitter contact 122 and channel segment 138 can be formed, for example, by depositing epitaxial layer 162 over epitaxial layer 160 by using a MOCVD process, an MBE process, or other deposition process and appropriately patterning epitaxial layer 162. Channel segment 140 can be, for example, a conductive channel segment. Further shown in FIG. 1, etch stop segment 124 is situated over emitter contact 122 and channel segment 136 is situated over channel segment 138. Etch stop segment 124 and channel segment 136 each comprise a portion of epitaxial layer 164, which can comprise, for example, lightly doped N type InGaP in one embodiment. Etch stop segment 124 and channel segment 136 can be formed, for example, by depositing epitaxial layer 164 over epitaxial layer 162 by using a MOCVD process or other deposition process and appropriately patterning epitaxial layer 164. Channel segment 136 can be, for example, a conductive channel segment.

Also shown in FIG. 1, emitter cap 126 is situated over etch stop segment 124 and contact regions 130 and 132 are situated over channel segment 136. Emitter cap 126 and contact regions 130 and 132 each comprise portions of epitaxial layer 166, which can comprise, for example, heavily doped N type GaAs in one embodiment. In one embodiment, epitaxial layer 166 can comprise heavily doped N type indium gallium arsenide (InGaAs). Emitter cap 126 and contact regions 130 and 132 can be formed, for example, by depositing epitaxial layer 166 over epitaxial layer 164 by using a MOCVD process, an MBE process, or other deposition process and appropriately patterning epitaxial layer 166.

In bipolar/dual FET 102, channel 134 of E-mode FET 108 is situated above and isolated from channel 146 of D-mode FET 110, which electrically and physically decouples E-mode FET 108 from D-mode FET 110. By decoupling E-mode FET 108 from D-mode FET 110, E-mode FET 108 and D-mode FET 110 can each be independently optimized for a particular application. For example, E-mode FET 108 can be optimized for analog applications, such as bias and control applications. D-mode FET 110 can be optimized, for example, for RF switching applications. However, E-mode FET 108 and D-mode FET 110 can also be utilized in digital logic circuits, for example.

Figure 2:
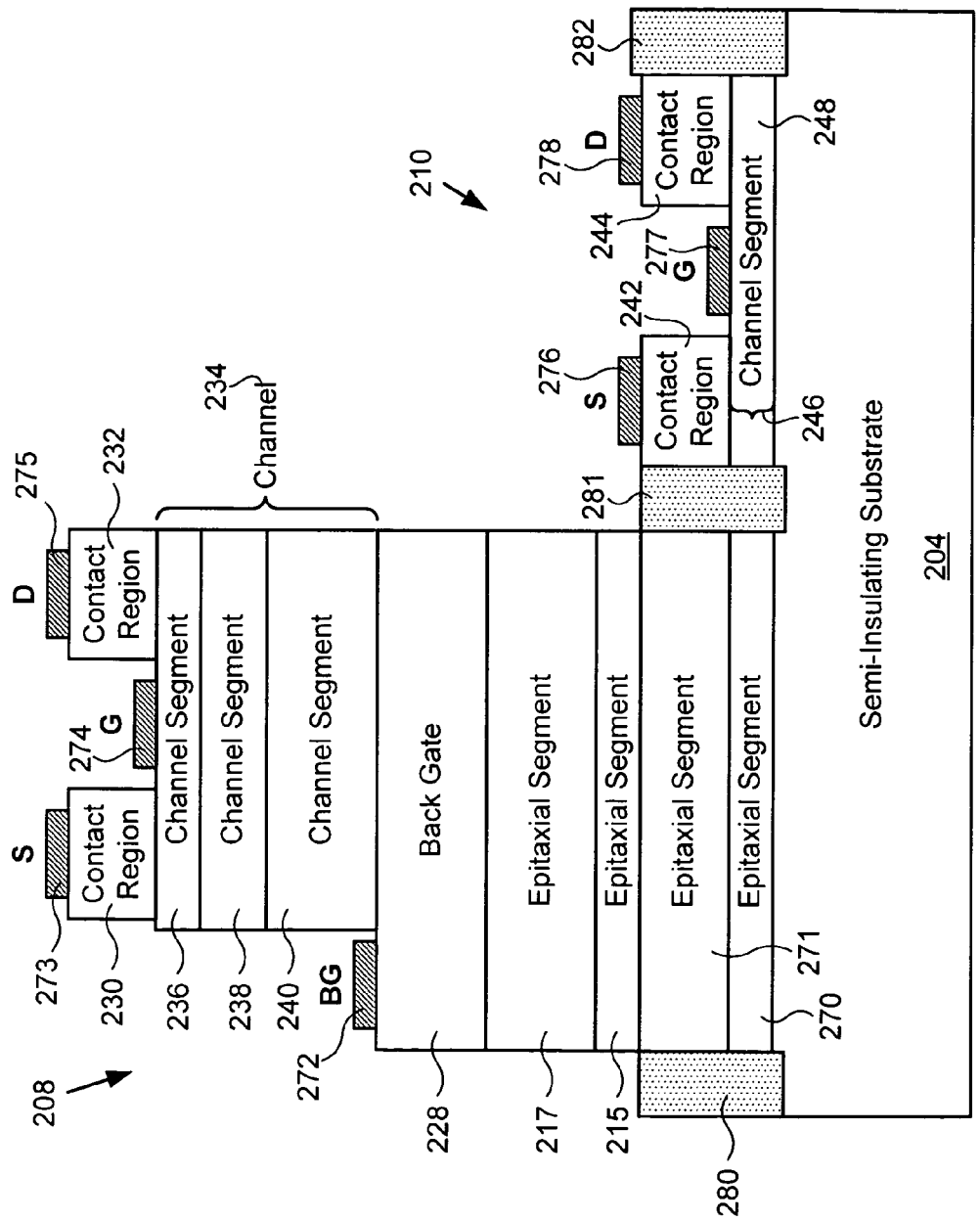
FIG. 2 illustrates a cross-sectional view of exemplary enhancement-mode and depletion-mode FETs in accordance with one embodiment of the present invention.

FIG. 2 shows a cross-sectional view of exemplary E-mode and D-mode FETs situated over a substrate in accordance with one embodiment of the present invention. In FIG. 2, E-mode FET 208 and D-mode FET 210 correspond, respectively, to E-mode FET 108 and D-mode FET 110 in bipolar/dual FET structure 102 in FIG. 1. In particular, epitaxial segments 215 and 217, back gate 228, contact regions 230, 232, 242, and 244, channels 234 and 246, and channel segments 236, 238, 240, and 248 in FIG. 2 correspond, respectively, to epitaxial segments 115 and 117, back gate 128, contact regions 130, 132, 142, and 144, channels 134 and 146, and channel segments 136, 138, 140, and 148 in FIG. 1. In FIG. 2, E-mode FET 208 includes back gate 228, contact regions 230 and 232, channel 234, channel segments 236, 238, and 240, and respective back gate, source, gate, and drain contacts 272, 273, 274, and 275. D-mode FET 210 includes contact regions 242 and 244, channel 246, channel segment 248, and respective source, gate, and drain contacts 276, 277, and 278.

As shown in FIG. 2, E-mode FET 208 is situated between isolation regions 280 and 281 and D-mode FET 210 is situated between isolation regions 281 and 282. Isolation regions 280, 281, and 282 are non-conductive regions for providing electrical isolation between adjacent transistors. In one embodiment, isolation regions 280, 281, and 282 can each comprise a implant-damage region. In such embodiment, isolation regions 280, 281, and 282 can each be formed by utilizing an implant process to damage the epitaxial structure of a selected portion of epitaxial layers 150 and 152 in FIG. 1. In one embodiment, isolations regions 280, 281, and 282 can each comprise a trench filled with, for example, nitride, polyimide, or other dielectric material. In such embodiment, isolation regions 280, 281, and 282 can each be formed by etching a trench in a selected portion of epitaxial layers 150 and 152 and filling the trench with a dielectric material, such as nitride or polyimide.

Also shown in FIG. 2, channel segment 248 is situated over substrate 204, gate contact 277 and contact regions 242 and 244 are situated over channel segment 248, source contact 276 is situated over contact region 242, and drain contact 278 is situated over contact region 244. Gate contact 277 can comprise a metal or metal stack, such as a metal stack comprising, for example, platinum-titanium-gold in one embodiment. Source contact 276 and drain contact 278 can be ohmic contacts and can comprise, for example, gold-nickel-germanium, palladium-germanium-gold, or other metal alloy. Gate contact 277 and source and drain contacts 276 and 278 can be formed, for example, by using a sputter process, an evaporation process, or other deposition process.

Further shown in FIG. 2, epitaxial segment 270 is situated over substrate 204 and epitaxial segment 271 is situated over epitaxial segment 270. Epitaxial segment 270 can comprise a portion of epitaxial layer 150 in FIG. 1 and epitaxial segment can comprise a portion of epitaxial layer 152 in FIG. 1. Also shown in FIG. 2, epitaxial segment 215 is situated over epitaxial segment 271, epitaxial segment 217 is situated over epitaxial segment 215, back gate 228 is situated over epitaxial segment 217, and back gate contact 272 and channel segment 240 are situated on back gate 228. Back gate contact 272 can comprise for example, titanium-platinum-gold, platinum-titanium-platinum-gold, or other metal alloy. Back gate contact 272 can be formed, for example, by using a sputter process, an evaporation process, or other deposition process.

Further shown in FIG. 2, channel segment 238 is situated over channel segment 240, channel segment 236 is situated over channel segment 238, contact regions 230 and 232 and gate contact 274 are situated over channel segment 236, source contact 273 is situated over contact region 230, and drain contact 275 is situated over contact region 232. Gate contact 274 is substantially similar to gate contact 277 in composition and formation and source and drain contacts 273 and 275 are substantially similar to source and drain contacts 276 and 278 in composition and formation.

As shown in FIG. 2, channel 246 of D-mode FET 210 is situated below channel 234 of E-mode FET 208 and isolation region 281 is situated between D-mode FET 210 and E-mode FET 208. As a result, channel 246 of D-mode FET 210 is isolated from channel 234 of E-mode FET 208, which advantageously decouples D-mode FET 210 from E-mode FET 208.

Figure 3:
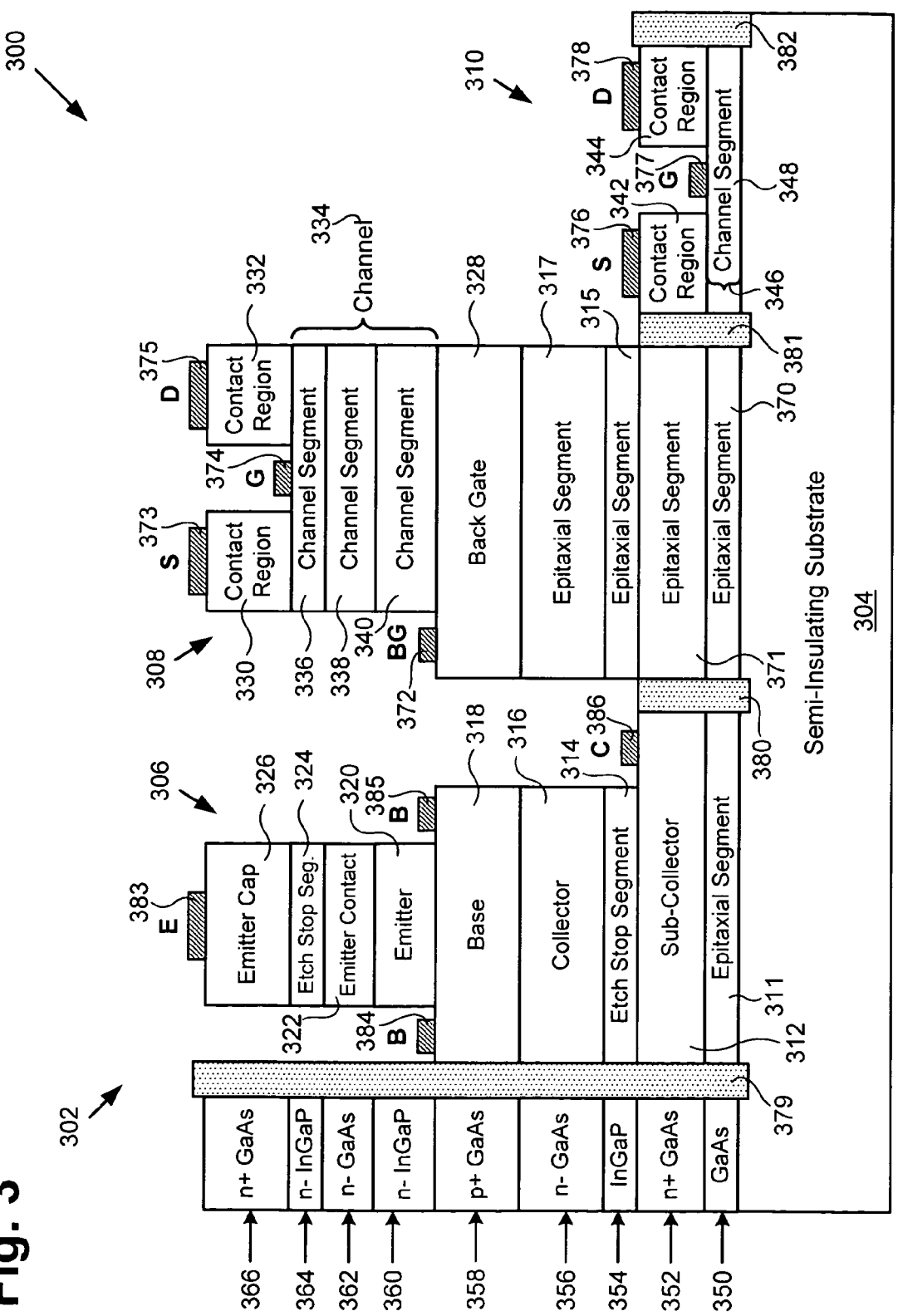
FIG. 3 illustrates a cross-sectional view of an exemplary bipolar/dual FET structure in accordance with one embodiment of the present invention.

FIG. 3 shows a cross-sectional view of a semiconductor die including an exemplary bipolar/dual FET structure in accordance with one embodiment of the present invention. Certain details and features have been left out of FIG. 3, which are apparent to a person of ordinary skill in the art. In FIG. 3, structure 300 includes bipolar/dual FET structure 302 on substrate 304. Structure 300 in FIG. 3 corresponds to structure 100 in FIG. 1. In particular, bipolar transistor 306, E-mode FET 308, D-mode FET 310, epitaxial segments 311, 315 and 317, sub-collector 312, etch stop segments 314 and 324, collector 316, base 318, emitter 320, emitter contact 322, emitter cap 326, back gate 328, contact regions 330, 332, 342, and 344, channels 334 and 346, channel segments 336, 338, 340, and 348, and epitaxial layers 350, 352, 354, 356, 358, 360, 362, 364, and 366 in FIG. 3 correspond, respectively, to bipolar transistor 106, E-mode FET 108, D-mode FET 110, epitaxial segments 111, 115 and 117, sub-collector 112, etch stop segments 114 and 124, collector 116, base 118, emitter 120, emitter contact 122, emitter cap 126, back gate 128, contact regions 130, 132, 142, and 144, channels 134 and 146, channel segments 136, 138, 140, and 148, and epitaxial layers 150, 152, 154, 156, 158, 160, 162, 164, and 166 in FIG. 1.

Also, E-mode FET 308 and D-mode FET 310 in FIG. 3 correspond, respectively, to E-mode FET 208 and D-mode FET 210 in FIG. 2. In particular, epitaxial segments 315, 317, 370, and 371, back gate 328, contact regions 330, 332, 342, and 344, channels 334 and 346, channel segments 336, 338, 340, and 348, source contacts 373 and 376, gate contacts 374 and 377, drain contacts 375 and 378, and isolation regions 380, 381, and 382 in FIG. 3 correspond, respectively, to epitaxial segments 215, 217, 270, and 271, back gate 228, contact regions 230, 232, 242, and 244, channels 234 and 246, channel segments 236, 238, 240, and 248, source contacts 273 and 276, gate contacts 274 and 277, drain contacts 275 and 278, and isolation regions 280, 281, and 282 in FIG. 2.

As shown in FIG. 3, bipolar transistor 306, which can comprise, for example, an HBT, is situated between isolation regions 379 and 380, E-mode FET 308 is situated between isolation regions 380 and 381, and D-mode FET 310 is situated between isolation regions 381 and 382. Isolation regions 380, 381, and 382 correspond, respectfully to isolation regions 280, 281, and 282 in FIG. 2, and isolation region 279 is substantially similar in composition and formation to isolation regions 280, 281, and 282. Also shown in FIG. 3, epitaxial segment 311 is situated over substrate 304, sub-collector 312 is situated over epitaxial layer 311 and etch stop segment 314 and collector contact 386 are situated over sub-collector 312. Collector contact 386 is substantially similar in composition and formation to source contact 376 and drain contact 378, which correspond, respectively, to source contact 276 and drain contact 278 in FIG. 2.

Further shown in FIG. 3, collector 316 is situated over etch stop segment 314, base 318 is situated over collector 316 and emitter 320 and base contacts 384 and 385 are situated over base 318. Base contacts 384 and 385 are substantially similar in composition and formation to back gate contact 372, which corresponds to back gate contact 272 in FIG. 2. Also shown in FIG. 3, emitter contact 322 is situated over emitter 320, etch stop segment 324 is situated over emitter contact 322, emitter cap 326 is situated over etch stop segment 324 and emitter contact 383 is situated over emitter cap 326. Emitter contact 383 is substantially similar in composition and formation to source contact 373 and drain contact 375, which correspond, respectively, to source contact 273 and drain contact 275 in FIG. 2.

Further shown in FIG. 3, epitaxial segment 370 is situated over substrate 304, epitaxial segment 371 is situated over epitaxial segment 370, epitaxial segment 315 is situated over epitaxial segment 371, epitaxial segment 317 is situated over epitaxial segment 315, back gate 328 is situated over epitaxial segment 317, and back gate contact 372 and channel segment 340 are situated over back gate 328. Also shown in FIG. 3, channel segment 338 is situated over channel segment 340, channel segment 336 is situated over channel segment 338, contact regions 330 and 332 and gate contact 374 are situated over channel segment 336, source contact 373 is situated over contact region 330, and drain contact 375 is situated over contact region 332. Further shown in FIG. 3, channel segment 348 is situated over substrate 304, contact regions 342 and 344 and gate contact 377 are situated over channel segment 348, source contact 376 is situated over contact region 342, and drain contact 378 is situated over contact region 344.

In bipolar/dual FET structure 302, E-mode FET 308 can be controlled by gate contact 374 and/or back gate contact 372. In one embodiment, E-mode FET 308 can be only controlled by gate contact 374. In another embodiment, E-mode FET 308 can be only controlled by back gate contact 372. In bipolar/dual FET structure 302, channel 334 of E-mode FET is situated above base 318 of bipolar transistor 306 and channel 346 of D-mode FET 310 is situated below sub-collector 312 of bipolar transistor 306. Thus, channel 346 of D-mode FET 310 is situated below channel 334 of E-mode FET 308, which isolates channel 346 of D-mode FET 310 from channel 334 of the E-mode FET. Also, E-mode FET 308 is isolated from D-mode FET 310 by isolation region 381.

By isolating channel 346 of D-mode FET 310 from channel 334 of E-mode FET 308 in bipolar/dual FET structure 302, channel 346 of D-mode FET 310 is decoupled, both electrically and physically, from channel 334 of E-mode FET 308. By decoupling channel 346 of D-mode FET 310 from channel 334 of E-mode FET 308, D-mode FET 310 is decoupled from E-mode FET 308. As a result, E-mode FET 308 and D-mode FET 310 can each be advantageously optimized for particular applications independently of each other. For example, E-mode FET 308 can be optimized for logic and analog control applications, while D-mode FET 310 can be optimized for RF switching applications.

In contrast, in a conventional structure having E-mode and D-mode FETs situated below a bipolar transistor sub-collector, the performance of the E-mode FET cannot be optimized without undesirably affecting the performance of the D-mode FET, and vice versa. Thus, by forming an E-mode FET over a D-mode FET, where the E-mode FET is decoupled from the D-mode FET, an embodiment of the invention provides a bipolar/dual FET structure having increased design flexibility compared to a conventional structure having E-mode and D-mode FETs situated under a bipolar transistor sub-collector.

Thus, as discussed above, an embodiment of the invention provides a bipolar/dual FET structure including an E-mode FET having a channel situated above a base of a bipolar transistor, such as an HBT, and a D-mode FET having a channel situated below a sub-collector of the bipolar transistor. As a result, an embodiment of the invention provides a bipolar/dual FET structure having an E-mode and D-mode FETs that are electrically and physically decoupled from each other, which advantageously enables the E-mode FET and the D-mode FET to be independently optimized for specific applications. As a result, the invention provides a bipolar/dual FET structure having increased design flexibility.

From the above description of embodiments of the present invention it is manifest that various techniques can be used for implementing the concepts of the present invention without departing from its scope. Moreover, while the present embodiments of the invention have been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A bipolar/dual FET structure situated on a substrate, said bipolar/dual FET structure comprising:
   a bipolar transistor situated over said substrate;
   an enhancement-mode FET and a depletion-mode FET situated over said substrate;
   a channel of said enhancement-mode FET being situated above a base of said bipolar transistor, and a channel of said depletion-mode FET being situated below said base of said bipolar transistor.

2. The bipolar/dual FET structure of claim 1, wherein said channel of said enhancement-mode FET is isolated from said channel of said depletion-mode FET so as to decouple said enhancement-mode FET from said depletion mode FET.

3. The bipolar/dual FET structure of claim 1, wherein said enhancement-mode FET further comprises a back gate situated under said channel of said enhancement-mode FET.

4. The bipolar/dual FET structure of claim 3, wherein said back gate and said base of said bipolar transistor each comprise a portion of a same epitaxial layer.

5. The bipolar/dual FET structure of claim 1, wherein said bipolar transistor further comprises a sub-collector, and wherein said sub-collector is situated above said channel of said depletion-mode FET.

6. The bipolar/dual FET structure of claim 5, wherein said depletion-mode FET further comprises a plurality of contact regions situated over said channel of said depletion-mode FET, and wherein each of said plurality of contact regions and said sub-collector comprise a portion of a same epitaxial layer.

7. The bipolar/dual FET structure of claim 1, wherein said depletion-mode FET further comprises source and drain contacts situated over said channel of said depletion-mode FET, and wherein said source and drain contacts are situated below said base of said bipolar transistor.

8. The bipolar/dual FET structure of claim 1, wherein said channel of said enhancement-mode FET comprises a plurality of channel segments.

9. The bipolar/dual FET structure of claim 8, wherein said bipolar transistor further comprises an emitter situated over said base, and wherein said emitter and one of said plurality of channel segments each comprise a portion of a same epitaxial layer.

10. The bipolar/dual FET structure of claim 1, wherein said substrate comprises gallium arsenide.

11. A bipolar/dual FET structure situated on a substrate, said bipolar/dual FET structure comprising:
    a bipolar transistor situated over said substrate, said bipolar transistor comprising a base situated over a collector and a sub-collector situated under said collector;
    an enhancement-mode FET and a depletion-mode FET situated over said substrate;
    a channel of said enhancement-mode FET being situated above said base of said bipolar transistor and a channel of said depletion-mode FET being situated below said sub-collector of said bipolar transistor, thereby decoupling said enhancement-mode FET from said depletion-mode FET.

12. The bipolar/dual FET structure of claim 11, wherein said enhancement-mode FET further comprises a back gate situated under said channel of said enhancement-mode FET.

13. The bipolar/dual FET structure of claim 12, wherein said back gate and said base of said bipolar transistor each comprise a portion of a same epitaxial layer.

14. The bipolar/dual FET structure of claim 1, wherein said depletion-mode FET further comprises a plurality of contact regions situated over said channel of said depletion-mode FET, and wherein each of said plurality of contact regions and said sub-collector comprise a portion of a same epitaxial layer.

15. The bipolar/dual FET structure of claim 14, wherein said depletion-mode FET further comprise a source contact situated over one of said plurality of contact regions, and wherein said source contact is situated below said collector of said bipolar transistor.

16. The bipolar/dual FET structure of claim 11, wherein said channel of said enhancement-mode FET comprises a plurality of channel segments.

17. The bipolar/dual FET structure of claim 16, wherein said bipolar transistor further comprises an emitter situated over said base, and wherein said emitter and one of said plurality of channel segments each comprise a portion of a same epitaxial layer.

18. The bipolar/dual FET structure of claim 11 further comprising an isolation region situated between said bipolar transistor and said enhancement-mode FET.

19. The bipolar/dual FET structure of claim 11 further comprising an isolation region situated between said enhancement-mode FET and said depletion-mode FET.

20. The bipolar/dual FET structure of claim 11, wherein said substrate comprises gallium arsenide.

* * * * *

UNITED STATES PATENT AND TRADEMARK OFFICE
CERTIFICATE OF CORRECTION

PATENT NO. : 7,755,107 B2
APPLICATION NO. : 12/284804
DATED : July 13, 2010
INVENTOR(S) : Peter J. Zampardi et al.

It is certified that error appears in the above-identified patent and that said Letters Patent is hereby corrected as shown below:

Column 9, line 10, in claim 14, line 1, please delete "claim 1" and replace with --claim 11--.

Column 9, line 17, in claim 15, line 2, please delete "comprise" and replace with --comprises--.

Signed and Sealed this

Twelfth Day of October, 2010

David J. Kappos
*Director of the United States Patent and Trademark Office*